United States Patent
Tews

(10) Patent No.: US 7,169,677 B2
(45) Date of Patent: Jan. 30, 2007

(54) METHOD FOR PRODUCING A SPACER STRUCTURE

(75) Inventor: Helmut Tews, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/519,201

(22) PCT Filed: May 14, 2003

(86) PCT No.: PCT/DE03/01551

§ 371 (c)(1),
(2), (4) Date: Aug. 24, 2005

(87) PCT Pub. No.: WO03/107405

PCT Pub. Date: Dec. 24, 2003

(65) Prior Publication Data

US 2006/0084234 A1    Apr. 20, 2006

(30) Foreign Application Priority Data

Jun. 17, 2002   (DE) ................ 102 26 914

(51) Int. Cl.
*H01L 21/336*  (2006.01)
*H01L 21/425*  (2006.01)
*H01L 21/338*  (2006.01)

(52) U.S. Cl. ............... 438/303; 438/299; 438/301; 438/287; 438/279; 438/305; 438/514; 438/696; 438/197; 438/153; 438/154; 438/186; 438/184; 438/369; 438/365; 438/366; 257/E21.167

(58) Field of Classification Search ........... 438/305, 438/514, 696, 197, 303, 301, 299, 287, 279, 438/153–154, 186, 184, 369, 365, 366
See application file for complete search history.

(56) References Cited

U.S. PATENT DOCUMENTS

| 5,032,535 A | 7/1991 | Kamijo et al. |
| 5,397,909 A | 3/1995 | Moslehi |
| 6,080,607 A | 6/2000 | Chang et al. |

(Continued)

FOREIGN PATENT DOCUMENTS

DE   100 11 885 A1   11/2001

OTHER PUBLICATIONS

International Search Report from PCT application No. PCT/DE03/01551.

(Continued)

*Primary Examiner*—Michael Lebentritt
*Assistant Examiner*—Mohsen Ahmadi
(74) *Attorney, Agent, or Firm*—Brinks Hofer Gilson & Lione

(57) ABSTRACT

A method for fabricating a spacer structure includes: forming a gate insulation layer having a gate deposition-inhibiting layer, a gate layer and a covering deposition-inhibiting layer on a semiconductor substrate, and patterning the gate layer and the covering deposition-inhibiting layer in order to form gate stacks. An insulation layer is deposited selectively using the deposition-inhibiting layers, thereby permitting highly accurate formation of the spacer structure.

16 Claims, 3 Drawing Sheets

U.S. PATENT DOCUMENTS

| | | | |
|---|---|---|---|
| 6,251,719 B1 * | 6/2001 | Wang | 438/238 |
| 6,258,682 B1 * | 7/2001 | Tseng | 438/305 |
| 6,297,116 B1 | 10/2001 | Che | |
| 6,319,839 B1 * | 11/2001 | Chien et al. | 438/704 |
| 6,844,252 B2 * | 1/2005 | Pan | 438/595 |
| 6,962,863 B2 * | 11/2005 | Yokoyama | 438/595 |
| 2001/0023120 A1 | 9/2001 | Tsunashima et al. | |

OTHER PUBLICATIONS

International Examination Report from PCT application No. PCT/DE03/01551.

D. Widmann, H. Mader and H. Friedrich, "Technologie hochintegrierter Schaltungen" pp. 62-67, Jun. 1996.

* cited by examiner

METHOD FOR PRODUCING A SPACER STRUCTURE

This application is the national stage application of international application number PCT/DE2003101551, filed on May 14, 2003, which claims the benefit of priority to German Patent Application DE 102 269 14.9, filed on Jun. 17, 2002, which is incorporated herein by reference.

The present invention relates to a method for fabricating a spacer structure, and in particular to a method for fabricating a spacer structure for field-effect transistors in a sub-100 nanometer range.

During the fabrication of field-effect transistors, as are used, for example, in MOS transistors but also in nonvolatile memory transistors, what are known as spacer structures or side wall insulations are used in particular for sufficient insulation of what are known as gate stacks and for the self-aligning formation of source/drain regions.

FIGS. 1A and 1B show simplified sectional views to illustrate significant fabrication steps involved in the fabrication of a spacer structure in accordance with the prior art. In accordance with FIG. 1A, during this process gate stacks G having a gate insulation layer 200 and a control or gate layer 300 above it are formed on a support substrate 100, which usually consists of a semiconductor material. Then, an insulation layer 400 is deposited with a substantially constant thickness, i.e. conformally, on the surface on the support substrate 100 and of the gate stacks G.

In accordance with FIG. 1B, in a subsequent fabrication step an isotropic etching process is carried out, such as for example reactive ion etching (RIE), resulting in the final spacer structure S400 which allows sufficient insulation or sufficient protection of the gate stacks G and, furthermore, allows self-aligning formation of the source/drain regions S and D in the support substrate 100, for example by means of ion implantation (not shown).

However, a drawback of a conventional method of this type for fabricating spacer structures is that control of the dimensions of the spacers S400 is inadequate. More specifically, the conformal deposition on the gate stacks G alone results in significant fluctuations in thickness between different spacers S400, and the use of reactive ion etching (RIE) also entails a risk of damage to a gate insulation layer or a gate oxide. Furthermore, there are in some cases considerable fluctuations in etching rate, which are dependent on a particular position on the wafer and on the spatial density of the gates. This in turn results in spacer structures of different thicknesses.

Particularly for the fabrication of field-effect transistors in a sub-100 nanometer range, which will be carried out as standard in the near future, however, fluctuations of this type in the spacer structures used will not be tolerable. The reasons for this are firstly that the minimum distance between adjacent gate stacks G is reduced in the same way, resulting in considerable problems during the deposition of insulation layers and etching clear of the support substrate. Since these spacer structures therefore act as self-aligning masks for the dimensions of implanted source/drain regions, conventional fabrication methods of this type for producing spacers can no longer be used in particular for feature sizes of the order of magnitude of 30 nanometers. In this respect, in particular the difficulties with lithography, the etching of the gate stack and the etching of the actual spacers should be mentioned.

The invention is therefore based on the object of providing a method for fabricating a spacer structure which has an increased level of accuracy.

For the first time, it is possible to form spacer structures even in a sub-100 nanometer range in a manner which can be controlled easily and with a high level of accuracy in particular by forming a gate insulation layer, a gate layer and a covering deposition-inhibiting layer on a semiconductor substrate, the gate insulation layer having a gate deposition-inhibiting layer, by subsequently patterning the gate layer and the covering deposition-inhibiting layer in order to form gate stacks and finally depositing an insulation layer selectively with respect to the deposition-inhibiting layers in the gate insulation layer and on the gate layer. The omission of the reactive ion etching process which is customarily used furthermore means that there is no risk of damage to the sensitive gate insulation layers.

In a further step, it is preferable to carry out an implantation in order to form lightly doped doping regions in the semiconductor substrate, so that a channel length can be set very accurately and in a self-aligning manner using the spacer structure.

In a further step, it is preferably possible to produce a further insulation layer selectively with respect to the deposition-inhibiting layers in order to form a widened spacer structure and to carry out a further implantation in order to form source/drain regions in the semiconductor substrate, resulting in a spacer structure with improved insulation properties which is suitable for forming the connection regions of a respective field-effect transistor in a self-aligning manner.

The deposition-inhibiting layers preferably comprise a nitride layer and/or an oxynitride layer with a high nitrogen content, in which case ozone-enhanced TEOS deposition is carried out during the selective formation of the insulation layer. In this case, not only is a particularly high-quality gate dielectric obtained, but also a particularly high selectivity is achieved during the deposition using standard materials.

The thin residual layers formed on the deposition-inhibiting layers during the selective deposition can optionally be removed by wet etching, with the result that contact openings for the source/drain regions and the gate layer can be formed in a particularly simple way.

To further improve the electrical properties of the spacer structure, the selectively deposited insulation layer can be thermally annealed and thereby densified.

In a further step, it is preferable for the deposition-inhibiting layers to be removed in order to uncover the gate layer and the source/drain regions in the semi-conductor substrate, for a material which can be silicided to be deposited over the entire surface and then for a surface layer of the uncovered semiconductor substrate and the gate layer to be converted using the material which can be silicided in order to form highly conductive connection regions.

The invention is described in more detail below on the basis of an exemplary embodiment and with reference to the drawing, in which:

FIGS. 2A to 2F show simplified sectional views to illustrate significant fabrication steps in the fabrication of a spacer structure in accordance with the present invention, reference being made, for example, to a standard process for the fabrication of CMOS transistors.

Accordingly, it is first of all possible to form active regions (not illustrated), for example by means of an STI (shallow trench isolation) process, in a support substrate 1, which preferably consists of a silicon semiconductor substrate. Then, to produce a gate insulation layer 2 having at least one gate deposition-inhibiting layer 2A, a nitride layer, such as for example $Si_3N_4$, and/or an oxynitride layer with a high nitrogen content (SiON) is formed, for example, by means of a deposition process on the support substrate 1. Alternatively, in accordance with FIG. 2A, this gate insulation layer 2 may also comprise a multiple layer comprising the gate deposition-inhibiting layer 2A described above (nitride layer and/or oxynitride layer with a high nitrogen content) and an oxide layer 2B, such as for example $SiO_2$. In this way, improved charge retention properties can be produced in particular in the region of nonvolatile semiconductor memory components.

Figure 1A:
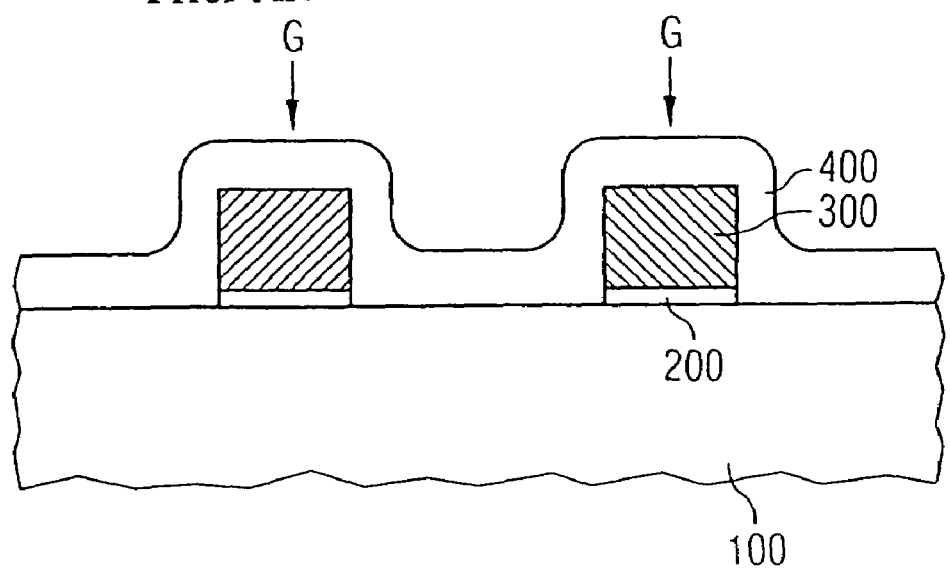
FIGS. 1A and 1B show simplified sectional views in order to illustrate significant fabrication steps in the fabrication of a spacer structure in accordance with the prior art.
Figure 1B:
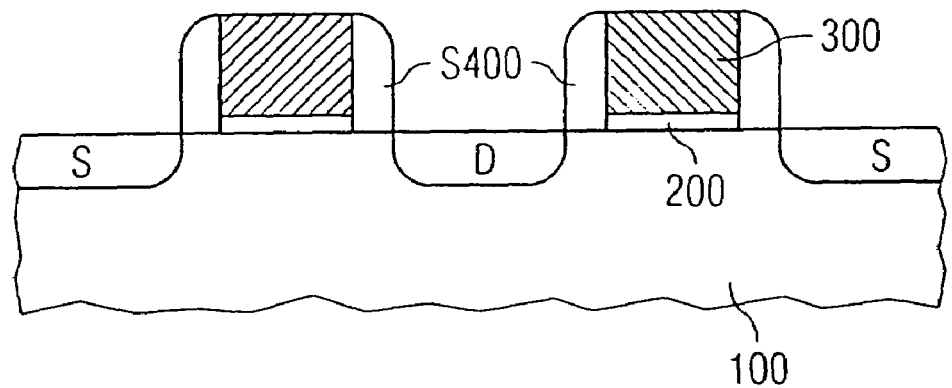
Figure 2A:
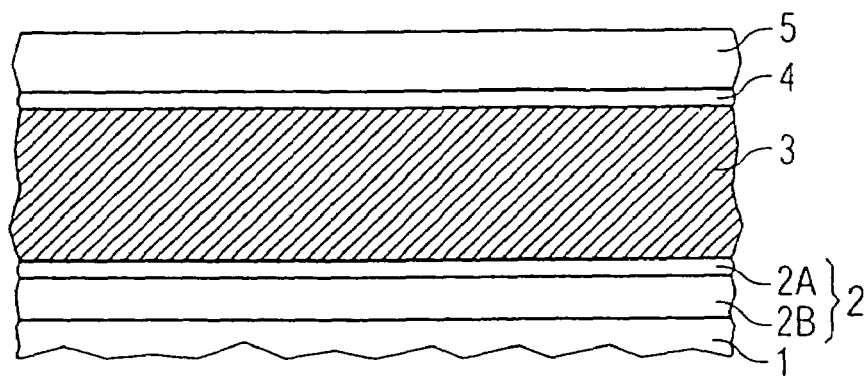
FIGS. 2A to 2F show simplified sectional views to illustrate significant fabrication steps in the fabrication of a spacer structure according to the invention.

Then, as shown in FIG. 2A, a control or gate layer 3 is formed, this preferably involving the deposition of semiconductor material (polysilicon or poly-SiGe) in a thickness of approx. 100 to 150 nanometers.

Furthermore, a covering deposition-inhibiting layer 4, which in the same way as the gate deposition-inhibiting layer 2A includes a nitride layer and/or an oxynitride layer with a high nitrogen content, is formed at the surface of the gate layer 3.

It is preferable for an approximately 5 to 10 nanometer thick silicon nitride layer 4, to be deposited at the surface of the gate layer 3 by means of an LPCVD process (low pressure chemical vapour deposition process). To pattern the layer sequence comprising the layers 3 and 4, by way of example it is possible to form a hard mask layer 5 at the surface of the covering deposition-inhibiting layer 4, in which case, by way of example, an approximately 50 nanometer thick TEOS layer is deposited as an oxide hard mask.

Figure 2B:
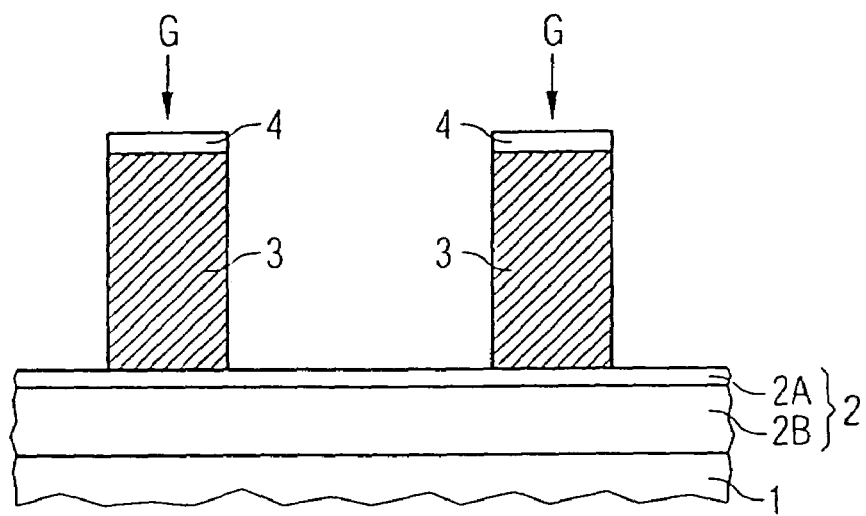

The actual patterning then takes place using, for example, photolithographic processes which are conventional and are therefore not illustrated, involving the application of a resist material, exposure and patterning of this material and then first of all patterning of the hard mask 5 using the patterned resist. Then, the resist is removed or stripped and the actual patterning of the layers 3 and 4 is carried out using the patterned hard mask 5 to form gate stacks G, the gate deposition-inhibiting layer 2A also being used as an etching stop layer. In this case, it is customary to use an anisotropic etching process, with the hard mask 5 ultimately being removed, resulting in the sectional view illustrated in FIG. 2B.

Figure 2C:
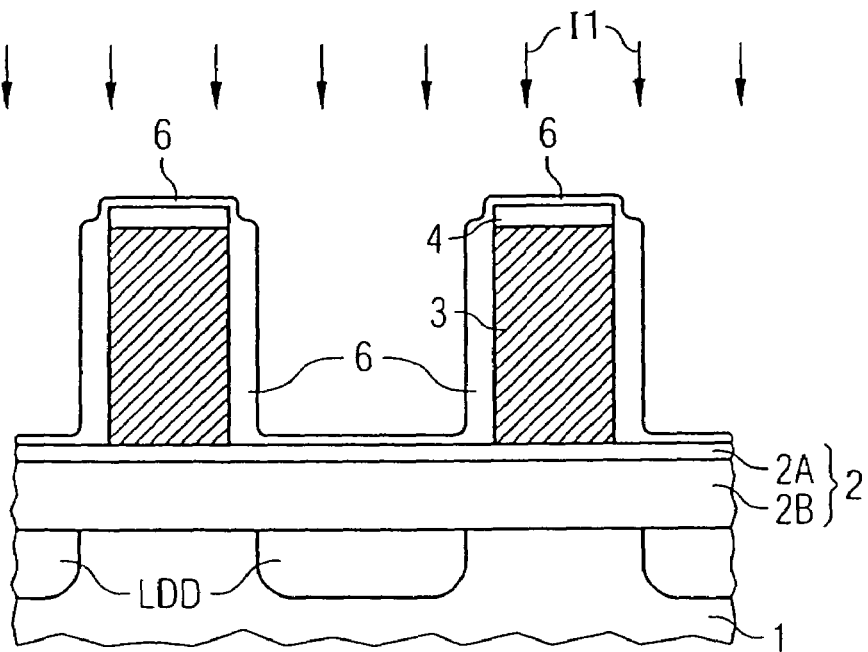

Then, in accordance with FIG. 2C, an insulation layer 6 is deposited selectively with respect to the gate deposition-inhibiting layer 2A between the gate stacks G and the covering deposition-inhibiting layer 4 on the gate stacks G. Particularly in the case of the nitride and/or oxynitride layers which are preferably used, an oxide deposition achieves selectivities in a range from 5 to 10, and consequently high oxide growth is established at the side walls of the gate stacks G, while only slight oxide growth is observed at the horizontal surface of the deposition-inhibiting layers 2A and 4. Using a selective oxide deposition of this type, it is possible for spacer structures with a thickness of, for example, 12 to 15 nanometers to be produced highly accurately and in a manner which can be controlled easily, with the result that it is now possible for even field-effect transistors in the sub-100 nanometer range to be produced in a simple and accurate way. In particular, however, there is no need to use any additional anisotropic etching processes, such as for example reactive ion etching (RIE), in this fabrication method, and consequently it is reliably possible to prevent the sensitive gate insulation layers from being damaged or destroyed.

Then, in accordance with FIG. 2C, in an optional implantation step it is possible to form lightly doped connection doping regions LDD using the selectively deposited insulation layer 6 in a self-aligning manner in the semiconductor substrate 1, with the result that effective channel lengths can be set highly accurately in particular with very small feature sizes of less than 100 nanometers.

For the selective deposition of the insulation layer 6 it is preferable to use an ozone-enhanced TEOS deposition process which can be carried out in a conventional chemical vapour deposition apparatus and can be implemented using an ozone-activated TEOS (tetraethyl orthosilicate). The growth of the insulation layer 6 or of the TEOS is in this case highly dependent on the uncovered silicon surfaces. Accordingly, significantly less TEOS growth takes place at the deposition-inhibiting layers 2A and 4, which in the case of nitride layers amounts to approximately one fifth of the growth on pure silicon.

The result is preferably a TEOS layer with a highly homogenous silicon oxide layer without deviations in the stoichiometry as a result of a gas flow ratio of the TEOS to ozone being very high at the start of a vapour deposition and subsequently being varied until an equilibrium state is established in which the gas flow ratio of TEOS to ozone is low.

By way of example, the gas flow ratio of TEOS to the ozone-containing gas is 10, while, in the stable or steady state of the gas flow ratio after about one minute, this ratio is 0.4. To determine the precise parameters, reference is made to "N. ELBEL, Z. GABRIC et al.: A new STI process spaced on selective oxide deposition, reported at the 1998 symposium on VLSI technology, Honolulu, Hi.", which describes a SELOX deposition process of this type.

This method advantageously also reduces the thickness of the deposition-inhibiting layers 2A and 4, with the result that these layers are easier to remove at a later stage. Since a method of this type also takes place at temperatures of between 350 degrees Celsius and 600 degrees Celsius, it is possible to keep the thermal loads on the semiconductor circuits to be formed at a low level in particular in a lower temperature range.

It is optionally possible, in accordance with FIG. 2C, to carry out what is known as a densification anneal or an additional oxidation step to densify the selectively deposited insulation layer 6, and in this way the electrical properties and in particular the insulation properties of this layer can be improved further.

The result is a spacer structure which can be set highly accurately even in a sub-100 nanometer range, with thickness changes along the side walls only being in the range from 5 to 7%, while the crystallographic orientations in the substrate 1 and in the gate layer 3 are highly independent of one another.

In addition to the spacer structure which is illustrated in FIG. 2C and is already eminently satisfactory, this structure can also be modified or widened. For example, the selectively deposited insulation layer can be partially etched by means of a conventional wet-etching process in such a manner that the very thin residual layers formed at the deposition-inhibiting layers 2A and 4 are completely removed and in this way the gate deposition-inhibiting layer 2A and the covering deposition-inhibiting layer 4 are uncovered.

Figure 2D:
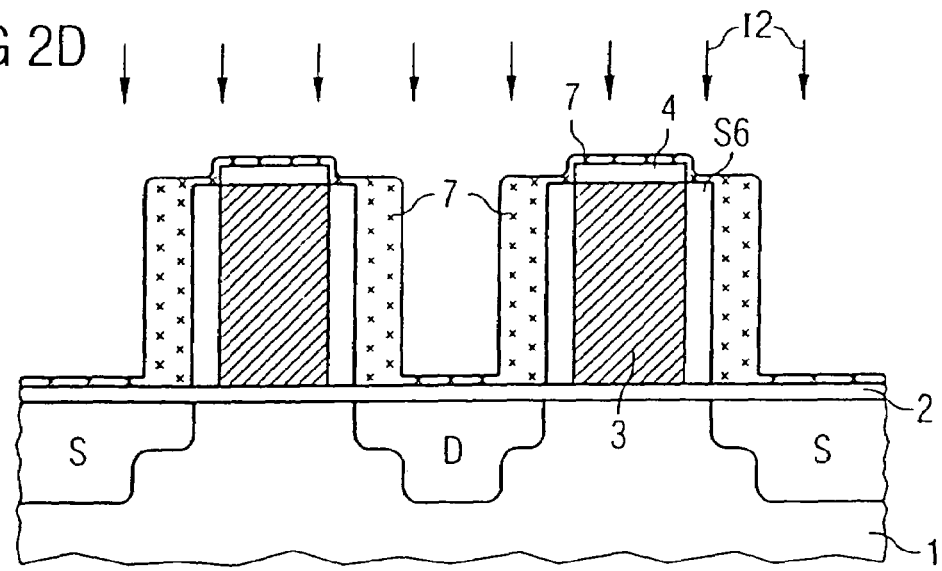

In accordance with FIG. 2D, it is in addition possible for one or further insulation layer(s) 7 to be deposited, once again selectively with respect to the deposition-inhibiting layers 2A and 4, a thicker oxide layer, preferably an oxide layer which is approximately 30 to 50 nanometers thick, then being formed at the side walls of the gate stacks G. The selective deposition process illustrated in FIG. 2D once again substantially corresponds to the selective deposition process shown in FIG. 2C, and consequently the description of this process will not be repeated below.

In accordance with FIG. 2D, following optional removal of the residual layers on the gate deposition-inhibiting-layer 2A and the covering deposition-inhibiting layer 4, it is once again possible to carry out a further implantation I2 in order to form the actual source/drain regions S/D in the semiconductor substrate 1, resulting in reduced resistances in the source/drain regions and improved electrical properties for the spacer structure comprising the insulation layers 6 and 7. Once again, a thermal anneal can be carried out in order to improve the electrical properties of the spacer structure, with the result that the deposited oxide is densified and the damage caused in the substrate 1 as a result of the implantation is annealed.

Figure 2E:
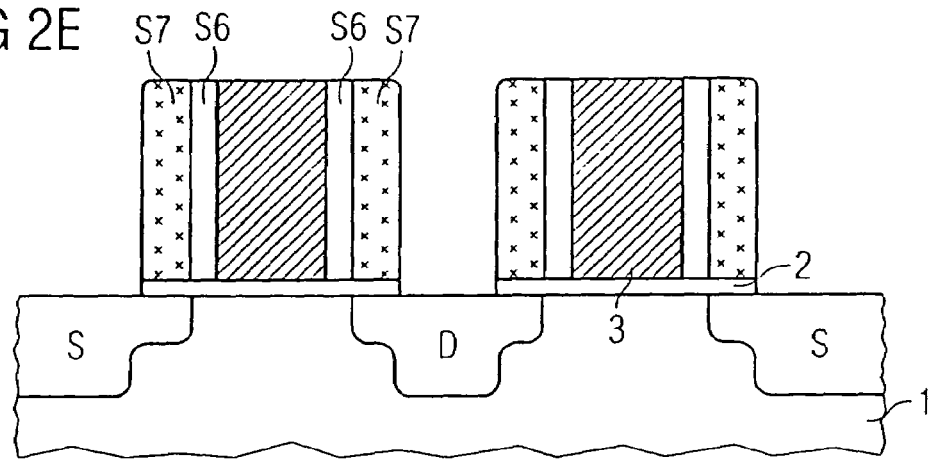

In accordance with FIG. 2E, in a subsequent step, by way of example, a wet etch is carried out, with the result that the deposition-inhibiting layers 2A and 4 are removed and the semiconductor substrate 1 and the gate layer 3 are uncovered. If the nitride layer and/or oxynitride layer is used as deposition-inhibiting layer 2A and/or 4, it is preferable to carry out a nitride wet-etching process.

Figure 2F:
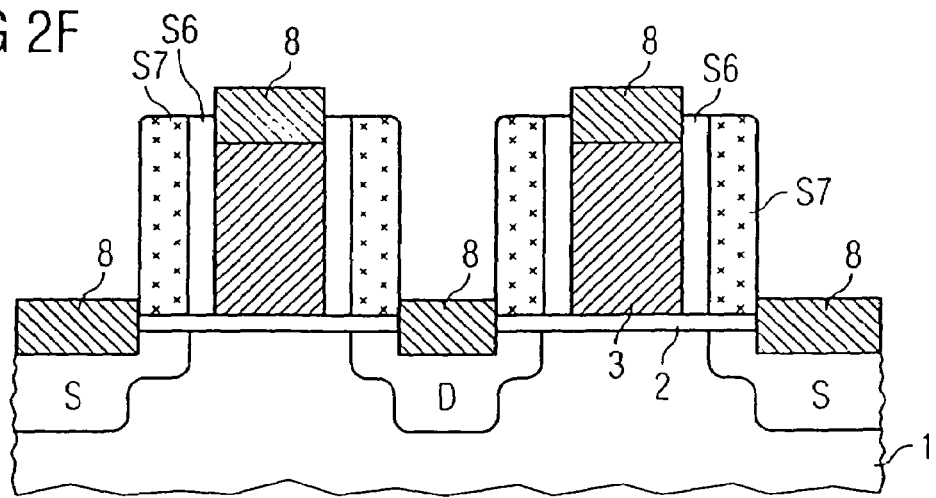

In accordance with FIG. 2F, to further improve the electrical conductivities of the gate layer 3 and of the source/drain regions S/D and/or to produce highly conductive connection regions, it is optionally possible first of all to deposit material which can be silicided or a metal layer which can be silicided, such as for example cobalt, nickel or platinum, over the entire surface. Then, the crystalline surface layer of the semiconductor substrate 1 or the polycrystalline surface layer of the gate layer 3 is converted, using the material which can be silicided, in order to form highly conductive connection regions 8, this material not forming a silicide at those surfaces which are not in contact with the semiconductor material (silicon), but rather the material which has been deposited (metal) remaining in place, for which reason selective back-etching of the deposited layer can once again be carried out by means of a preferably wet-chemical etching process. In this way, it is possible to carry out a multiplicity of patterning steps using only a single etching chamber in order to form the spacer structures and the connection regions, which means that the fabrication costs are reduced further.

If cobalt, nickel or platinum is used, the highly conductive connection regions 8 which result are cobalt, nickel or platinum silicide layers, which can be formed in a self-aligning manner by means of the spacer structures which have been formed in the novel way.

The transistor structure is completed in the usual way, and consequently these steps do not need to be explained in more detail below.

The invention has been described above on the basis of a CMOS transistor but is not restricted to this particular application and also in the same way encompasses other semiconductor components which have field-effect transistors with spacer structures, such as for example nonvolatile semiconductor memory components.

Furthermore, the invention is not restricted to the nitride and/or oxynitride layers described as deposition-inhibiting layers in combination with the Selox process described, but rather in the same way also encompasses alternative deposition-inhibiting layers and associated selective deposition processes.

LIST OF REFERENCE SYMBOLS 1, 100 Semiconductor substrate
2, 200 Gate insulation layer
3, 300 Gate layer
2A Gate deposition-inhibiting layer
2B Oxide layer
4 Covering deposition-inhibiting layer
400 Insulation layer
S400 Conventional spacer structure
5 Hard mask layer
6, 7 Selectively deposited insulation layer
S6, S7 Spacer structure
8 Connection region
I1, I2 Ion implantation
G Gate stack
S source region
D drain region
LDD connection doping region

The invention claimed is:

1. A method for fabricating a spacer structure, the method comprising:
   a) forming a gate insulation layer having a gate deposition-inhibiting layer, a gate layer and a covering deposition-inhibiting layer on a semiconductor substrate, wherein the gate deposition-inhibiting layer and the covering deposition-inhibiting layer include at least one of a nitride layer and an oxynitride layer;
   b) patterning the gate layer and the covering deposition-inhibiting layer in order to form gate stacks; and
   c) depositing an insulation layer selectively with respect to the deposition-inhibiting layers to form the spacer structure;
   d) carrying out an implantation in order to form connection doping regions in the semiconductor substrate;
   e) depositing a further insulation layer selectively with respect to the deposition-inhibiting layers in order to form a widened spacer structure; and
   f) carrying out a further implantation in order to form source/drain regions in the semiconductor substrate.

2. The method according to claim 1, wherein the at least one of nitride layers and oxynitride layers have high nitrogen content, and ozone-enhanced TEOS deposition is carried out in.

3. The method according to claim 1, wherein the selectively deposited insulation layers side walls of the gate stack have spacer layers and at the deposition-inhibiting layers have thin residual layers, the method comprising removing the residual layers by wet etching.

4. The method according to claim 1, further comprising densifying the selectively deposited Insulation layers.

5. The method according to claim 1, further comprising:
   g) removing the deposition-inhibiting layers in order to uncover the gate layer and the semiconductor substrate;
   h) depositing a material which can be silicided; and
   i) converting a surface layer of the uncovered semiconductor substrate and the gate layer using the material which can be silicided in order to form highly conductive connection regions for source/drain regions and the gate layer.

6. The method according to claim 1, wherein the gate layer includes polycrystalline silicon and the semiconductor substrate includes crystalline silicon.

7. The method according to claim 1, wherein the deposition-inhibiting layers include at least one of nitride layers and oxynitride layers with a high nitrogen content, and ozone-enhanced TEOS deposition is carried out in at least one of step c) and step e).

8. The method according to claim 1, further comprising densifying one of the selectively deposited insulation layers in c) or e).

9. A method of fabricating a sub-100 nanometer field-effect transistor, the method comprising fabricating a spacer structure, fabrication of the spacer structure comprising:
    a) forming a gate insulation layer having a gate deposition-inhibiting layer, a gate layer and a covering deposition-inhibiting layer on a semiconductor substrate;
    b) patterning the gate layer and the covering deposition-inhibiting layer in order to form gate stacks;
    c) depositing an insulation layer selectively with respect to the deposition-inhibiting layers to form the spacer structure;
    d) carrying out an implantation in order to form connection doping regions in the semiconductor substrate;
    e) depositing a further insulation layer selectively with respect to the deposition-inhibiting layers in order to form a widened spacer structure; and
    f) carrying out a further implantation in order to form source/drain regions in the semiconductor substrate, wherein the gate deposition-inhibiting layer and the covering deposition-inhibiting layer include at least on of a nitride layer and an oxynitride layer.

10. The method according to claim 9, wherein the at least one of nitride layers and oxynitride layers have a high nitrogen content, and ozone-enhanced TEOS deposition is carried out in c).

11. The method according to claim 9, wherein the selectively deposited insulation layers at side walls of the gate stack have spacer layers and at the deposition-inhibiting layers have thin residual layers, the method comprising removing the residual layers by wet etching.

12. The method according to claim 9, further comprising densifying the selectively deposited insulation layer.

13. The method according to claim 9, further comprising:
    g) removing the deposition-inhibiting layers in order to uncover the gate layer and the semiconductor substrate;
    h) depositing a material which can be silicided; and
    i) converting a surface layer of the uncovered semiconductor substrate and the gate layer using the material which can be silicided in order to form highly conductive connection regions for source/drain regions and the gate layer.

14. The method according to claim 9, wherein the gate layer includes polycrystalline silicon and the semiconductor substrate includes crystalline silicon.

15. The method according to claim 9, wherein the at least one of nitride layers and oxynitride layers have a high nitrogen content, and ozone-enhanced TEOS deposition is carried out in at least one of step c) and step e).

16. The method according to claim 9, further comprising densifying one of the selectively deposited insulation layers in c) or e).

* * * * *